United States Patent
Tsai et al.

(10) Patent No.: US 11,933,847 B2
(45) Date of Patent: Mar. 19, 2024

(54) APPARATUS AND SYSTEM FOR DEBUGGING SOLID-STATE DISK (SSD) DEVICE

(71) Applicant: Silicon Motion, Inc., Zhubei (TW)

(72) Inventors: Han-Chih Tsai, Zhubei (TW); Ming-Kun Chung, Zhubei (TW)

(73) Assignee: SILICON MOTION, INC., Zhubei (TW)

( * ) Notice: Subject to any disclaimer, the term of this patent is extended or adjusted under 35 U.S.C. 154(b) by 106 days.

(21) Appl. No.: 17/737,351

(22) Filed: May 5, 2022

(65) Prior Publication Data

US 2022/0413048 A1     Dec. 29, 2022

Related U.S. Application Data

(60) Provisional application No. 63/215,732, filed on Jun. 28, 2021.

(30) Foreign Application Priority Data

Sep. 27, 2021   (CN) .......................... 202111134188.5

(51) Int. Cl.
*G06F 11/00*     (2006.01)
*G01R 31/3183*   (2006.01)
(Continued)

(52) U.S. Cl.
CPC ........ *G01R 31/318597* (2013.01); *G01R 31/318307* (2013.01); *G01R 31/318572* (2013.01);
(Continued)

(58) Field of Classification Search
CPC ........... G01R 31/318307; G06F 11/263; G06F 11/273; G06F 11/2733
See application file for complete search history.

(56) References Cited

U.S. PATENT DOCUMENTS 8,949,672 B1 *   2/2015   Srihamat ............... G06F 11/366
                                                    714/38.1
8,966,319 B2 *   2/2015   Fai ........................ G06F 11/362
                                                    714/42
(Continued)

FOREIGN PATENT DOCUMENTS

CN          201282473 Y       7/2009
CN          109710451 A       5/2019
(Continued)

OTHER PUBLICATIONS

"ESP32 JTAG Debugging using Raspberry Pi" by Uri Shaked. retrieved from https://blog.wokwi.com/gdb-debugging-esp32-using-raspberry-pi/. available as early as Apr. 11, 2021 via archive.org. (Year: 2021).*

(Continued)

*Primary Examiner* — Philip Guyton
(74) *Attorney, Agent, or Firm* — Birch, Stewart, Kolasch & Birch, LLP

(57) ABSTRACT

The invention relates to an apparatus and a system for debugging a solid-state disk (SSD) device. The apparatus includes a Joint Test Action Group (JTAG) add-on board; and a Raspberry Pi. The Raspberry Pi includes a General-Purpose Input/Output (GPIO) interface (I/F), coupled to the JTAG add-on board; and a processing unit, coupled to the GPIO I/F. The processing unit is arranged operably to: simulate to issue a plurality of JTAG command through the GPIO I/F to the SSD device for dumping data generated by the SSD device during operation from the SSD device.

18 Claims, 9 Drawing Sheets

(51) Int. Cl.
    *G01R 31/3185* (2006.01)
    *G06F 11/10* (2006.01)
    *G06F 11/263* (2006.01)
    *G06F 11/273* (2006.01)
    *G06F 13/38* (2006.01)

(52) U.S. Cl.
    CPC ........ *G06F 11/1004* (2013.01); *G06F 11/263* (2013.01); *G06F 11/273* (2013.01); *G06F 13/382* (2013.01)

(56) References Cited

U.S. PATENT DOCUMENTS

| | | | |
|---|---|---|---|
| 9,672,091 B2* | 6/2017 | Singaravelu Vanaja | ................... G06F 11/0727 |
| 9,830,297 B2 | 11/2017 | Cappaert et al. | |
| 10,527,673 B2 | 1/2020 | Blankenburg et al. | |
| 2016/0275036 A1* | 9/2016 | Chew | ................ G06F 13/4282 |
| 2017/0357609 A1 | 12/2017 | Long et al. | |
| 2019/0129774 A1 | 5/2019 | Konan et al. | |
| 2019/0236044 A1 | 8/2019 | Rust et al. | |
| 2020/0013476 A1* | 1/2020 | Konan | ................ G06F 13/4282 |
| 2020/0073841 A1 | 3/2020 | Heyd et al. | |
| 2020/0300911 A1 | 9/2020 | Shanbhogue et al. | |
| 2022/0253395 A1* | 8/2022 | Nguyen | ................ G06F 13/409 |
| 2022/0413047 A1* | 12/2022 | Jiang | .................... G11C 29/16 |
| 2022/0413048 A1* | 12/2022 | Tsai | ............... G01R 31/318572 |
| 2022/0413766 A1* | 12/2022 | Yeh | ...................... G06F 3/0679 |

FOREIGN PATENT DOCUMENTS

| | | |
|---|---|---|
| TW | 201710919 A | 3/2017 |
| TW | 201908974 A | 3/2019 |
| WO | WO 2017/003544 A1 | 1/2017 |

OTHER PUBLICATIONS

English Translation of Taiwanese Search Report for Taiwanese Application No. 110135718, dated Aug. 31, 2022.

* cited by examiner

| Name | Pin# | | Pin# | Name |
|---|---|---|---|---|
| 3.3V | 1 | | 2 | 5V |
| GPIO02 | 3 | | 4 | 5V |
| GPIO03 | 5 | | 6 | Ground |
| GPIO04 | 7 | | 8 | GPIO14 |
| Ground | 9 | | 10 | GPIO15 |
| GPIO17 | 11 | | 12 | GPIO18 |
| GPIO27 | 13 | | 14 | Ground |
| GPIO22 | 15 | | 16 | GPIO23 |
| 3.3V | 17 | | 18 | GPIO24 |
| GPIO10 | 19 | | 20 | Ground |
| GPIO09 | 21 | | 22 | GPIO25 |
| GPIO11 | 23 | | 24 | GPIO08 |
| Ground | 25 | | 26 | GPIO07 |
| ID_SD | 27 | | 28 | ID_SC |
| GPIO05 | 29 | | 30 | Ground |
| GPIO06 | 31 | | 32 | GPIO12 |
| GPIO13 | 33 | | 34 | Ground |
| GIOP19 | 35 | | 36 | GPIO16 |
| GPIO26 | 37 | | 38 | GPIO20 |
| Ground | 39 | | 40 | GPIO21 |

APPARATUS AND SYSTEM FOR DEBUGGING SOLID-STATE DISK (SSD) DEVICE

CROSS-REFERENCE TO RELATED APPLICATIONS

This application claims the benefit of priority to U.S. Provisional Application Ser. No. 63/215,732, filed on Jun. 28, 2021; and Patent Application No. 202111134188.5, filed in China on Sep. 27, 2021; the entirety of which is incorporated herein by reference for all purposes.

BACKGROUND

The disclosure generally relates to storage devices and, more particularly, to an apparatus and a system for debugging solid-state disk (SSD) devices.

The problems encountered by using the commercially available in-circuit emulator (ICE) to collect firmware (FW) statuses during the operations of SSD products include: Firstly, the ICE cannot be fully controlled to meet all application environments. For example, the ICE device when being stopped performs regular operations, such as stopping the central processing unit (CPU) in the SSD product, etc., which causes a host to be unable to access to data in the SSD product later. Secondly, the response of ICE is very slow when the FW reads hardware (HW) registers after an address changing is required. For example, the debugging engineer wants to access to the HW registers to know the NAND flash statuses when the FW is stuck. Thirdly, the ICE is expensive and the debugging cost needs to be reduced. Thus, it is desirable to have an apparatus and a system for debugging SSD devices to address or alleviate the aforementioned problems.

SUMMARY

In an aspect of the invention, an embodiment introduces an apparatus for debugging a solid-state disk (SSD) device to include: a Joint Test Action Group (JTAG) add-on board; and a Raspberry Pi. The Raspberry Pi includes a General-Purpose Input/Output (GPIO) interface (I/F), coupled to the JTAG add-on board; and a processing unit, coupled to the GPIO I/F. The processing unit is arranged operably to: simulate to issue a plurality of JTAG command through the GPIO I/F to the SSD device for dumping data generated by the SSD device during operation from the SSD device.

In another aspect of the invention, an embodiment introduces a system for debugging SSD devices to include a debugging device. The debugging device includes a JTAG add-on board; and a Raspberry Pi. The HAG add-on board includes a first GPIO I/F, and a type-C I/F. The Raspberry Pi includes a second GPIO I/F, coupled to the first GPIO I/F; and a processing unit, coupled to the second GPIO I/F. The processing unit is arranged operably to: simulate to issue a plurality of JTAG command through the second GPIO I/F to the SSD device for dumping data generated by the SSD device during operation from the SSD device.

Both the foregoing general description and the following detailed description are examples and explanatory only, and are not restrictive of the invention as claimed.

BRIEF DESCRIPTION OF THE DRAWINGS

FIG. 3 is a schematic diagram illustrating Argonaut Reduced Instruction Set Computer Core (ARC) auxiliary register set according to an embodiment of the invention.

DETAILED DESCRIPTION

Reference is made in detail to embodiments of the invention, which are illustrated in the accompanying drawings. The same reference numbers may be used throughout the drawings to refer to the same or like parts, components, or operations.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent." etc.)

Figure 1:
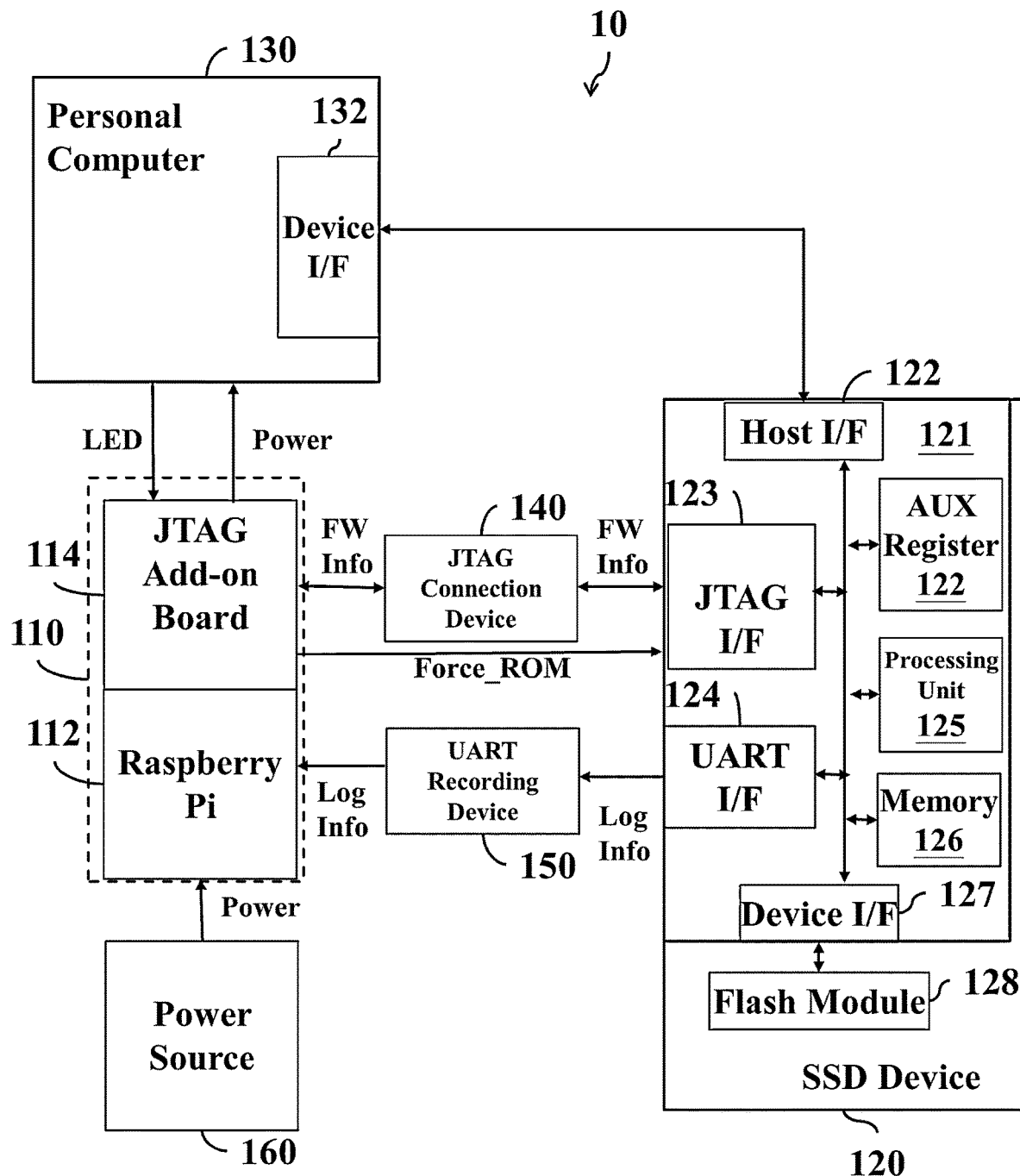
FIG. 1 is the block diagram of debugging system according to an embodiment of the invention.

Refer to FIG. 1 illustrating a block diagram for a debugging system. The debugging system 10 includes the debugging device 120, the personal computer (PC) 130, the Joint Test Action Group (JTAG) connection device 140, the Universal Asynchronous Receiver/Transmitter (UART) recording device 150 and the power source 160. The solid-state disk (SSD) device 120 is provided on the PC 130. The debugging device 110 draws power from the power source 160 and supplies power to the personal computer 130, the JTAG connection device 140 and the UART recording device 150. The PC 130 supplies power to the SSD device 120.

The SSD 120 device is a device to be debugged, and at least includes a flash controller 121 and a flash module 128. The flash module 128 provides huge storage space typically in hundred Gigabytes (GBs), or even several Terabytes (TBs), for storing a wide range of user data, such as high-resolution images, video files, etc. The flash controller 121 includes the host interface (I/F) 129 for connecting to the PC 130 to draw power. The host I/F 129 and the device I/F 132 of the PC 130 may communicate with each other by Universal Serial Bus (USB), Advanced Technology Attachment (ATA), Serial Advanced Technology Attachment (SATA), Peripheral Component Interconnect Express (PCI-E), Universal Flash Storage (UFS), Embedded Multi-Media Card (eMMC) protocol, or others. The flash controller 121 includes the processing unit 125, which communicates with the host I/F 121, the auxiliary (AUX) register 122, the JTAG 123, the UART I/F 124, the memory 126 and the device I/F 127 each other through bus architecture for transmitting and receiving such as commands, control signals, messages, data, etc. The processing unit 125 may be implemented in numerous ways, such as with general-purpose hardware (e.g., a microcontroller unit, a single processor, multiple processors or graphics processing units capable of parallel computations, or others) that is programmed using firmware and/or software instructions to access to the auxiliary register 122 and the memory 126 for reading and storing such as variables, data tables, data, messages, etc. during the execution. For example, the processing unit 125 may be Argonaut Reduced Instruction Set Computer (RISC) Core (or ARC for short). Argonaut RISC Machine (or ARM for short), or others. The content stored in the auxiliary register 122 and the memory 126 are important references (or clues) for debugging. In some embodiments, the memory 126 may be a static random access memory (SRAM). In alternative embodiments, the memory 126 may be a SRAM and a dynamic random access memory (DRAM). The device I/F 127 and the flash module 128 may communicate with each other by a Double Data Rate (DDR) protocol, such as Open NAND Flash Interface (ONFI), DDR Toggle, or others, for reading, programming or erasing data. The SSD device 120 connects to the JTAG connection device 140 through JTAG I/F, and to the UART recording device 150 through UART I/F.

Figure 3:
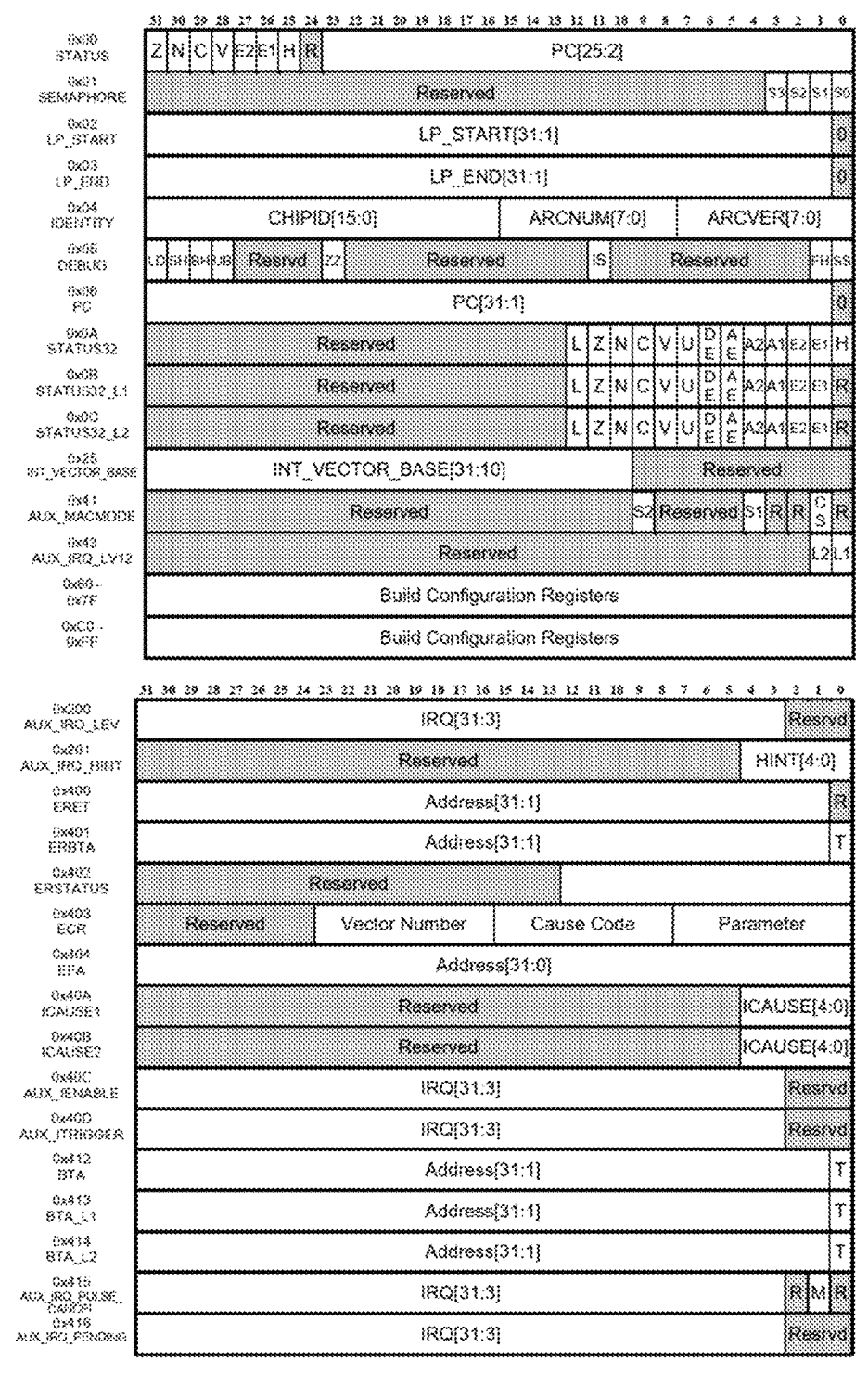
Figure 4:
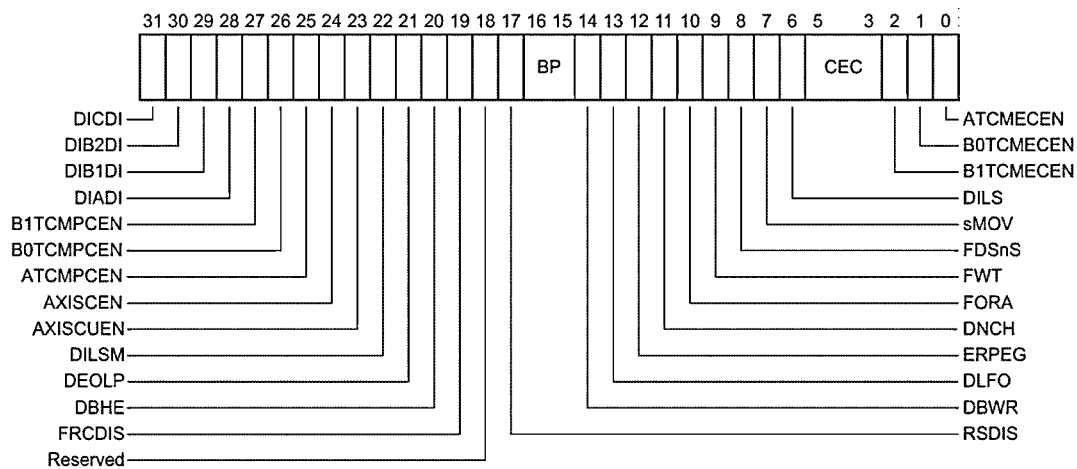
FIG. 4 is a schematic diagram illustrating bit assignments for Argonaut RISC Machine (ARM) auxiliary control register and secondary auxiliary control register according to an embodiment of the invention.
Figure 4:
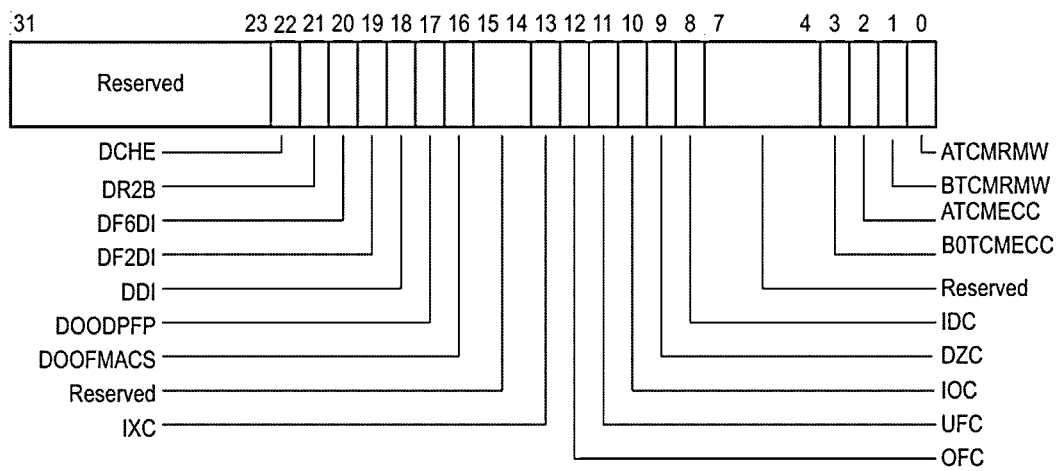

The auxiliary register 122 may conform to ARC, ARM, or other specifications. For example, FIG. 3 shows a summary of the auxiliary register set taken from pages 45-46 of *ARCCompact™ Instruction Set Architecture: Programmer's Reference*, April 2008. Part A in FIG. 4 shows the bit assignments of auxiliary control register excerpted from page 4-41 of *Cortex™-R5 and Cortex-R5F revision:r1p1, Technical Reference Manual* published in 2010-2011. Part B in FIG. 4 shows the bit assignments of secondary auxiliary control register excerpted from page 4-45 of *Cortex™-R5 and Cortex-R5F revision:r1p1, Technical Reference Manual* published in 2010-2011.

An embodiment of the invention utilizes the debugging device 110, the JTAG connection device 140 and the DART recording device 150 to replace the commercially available in-circuit emulator (ICE), so as to avoid the technical problems encountered during a debugging of hardware and software in the SSD device 120 by using the ICE. Moreover, the dubbing cost using the debugging device 110, the JTAG connection device 140 and the PART recording device 150 is lower than that using the ICE.

The debugging device 110, the kernel of the debugging system 10, includes the Raspberry Pi 112 and the JTAG add-on board 114. The raspberry Pi 112 is a single-board computer based on Linux operating system (OS). The debugging application runs on the Raspberry Pi 112, and the firmware to be debugged runs on the SSD device 120. The Raspberry Pi 112 when executing the debugging application fees the power source 160 into the PC 130 through the General-Purpose Input/Output (GPIO) I/F to start the PC 130, so that the SSD device 120 is also started up. Next, it is determined whether the PC 130 is successfully started according to the signal for driving the light-emitting diode (LED). Since the JTAG I/F can be driven by common IO signals, the Raspberry Pi 112 when executing the debugging application simulates the JTAG behavior through the built-in GPIO I/F to obtain the required information from the SSD device 120, and the access speed may be faster than 4 Mbps. The communications protocol of JTAG may refer to the *IEEE Standard Test Access Port and Boundary-Scan Architecture* admitted on Jun. 14, 2001. The Raspberry Pi 112 when executing the debugging application forces the SSD device 120 to enter the read-only memory (ROM) mode through the built-in GPIO I/F and the JTAG connection device 140. When the SSD device 120 enters the ROM mode, the processing unit 125 loads program code from the ROM (not shown in FIG. 1) and executes the program code to perform operations for booting up the system, such as a wide range of hardware tests, etc. The Raspberry Pi 112 when executing the debugging application collects such as DART data, signals, messages, etc. through the built-in USB a and the UART recording device 150. An engineer may manipulate the Raspberry Pi 112 to debug the hardware of the SSD device 120 and/or the firmware executed in the SSD device 120. For example, the Raspberry Pi 112 may be equipped with the Wi-Fi or the Bluetooth module, and the engineer may establish a remote connection with the Raspberry Pi 112 through the Wi-Fi or the Bluetooth module thereof to control the debugging device 110.

Figure 2:
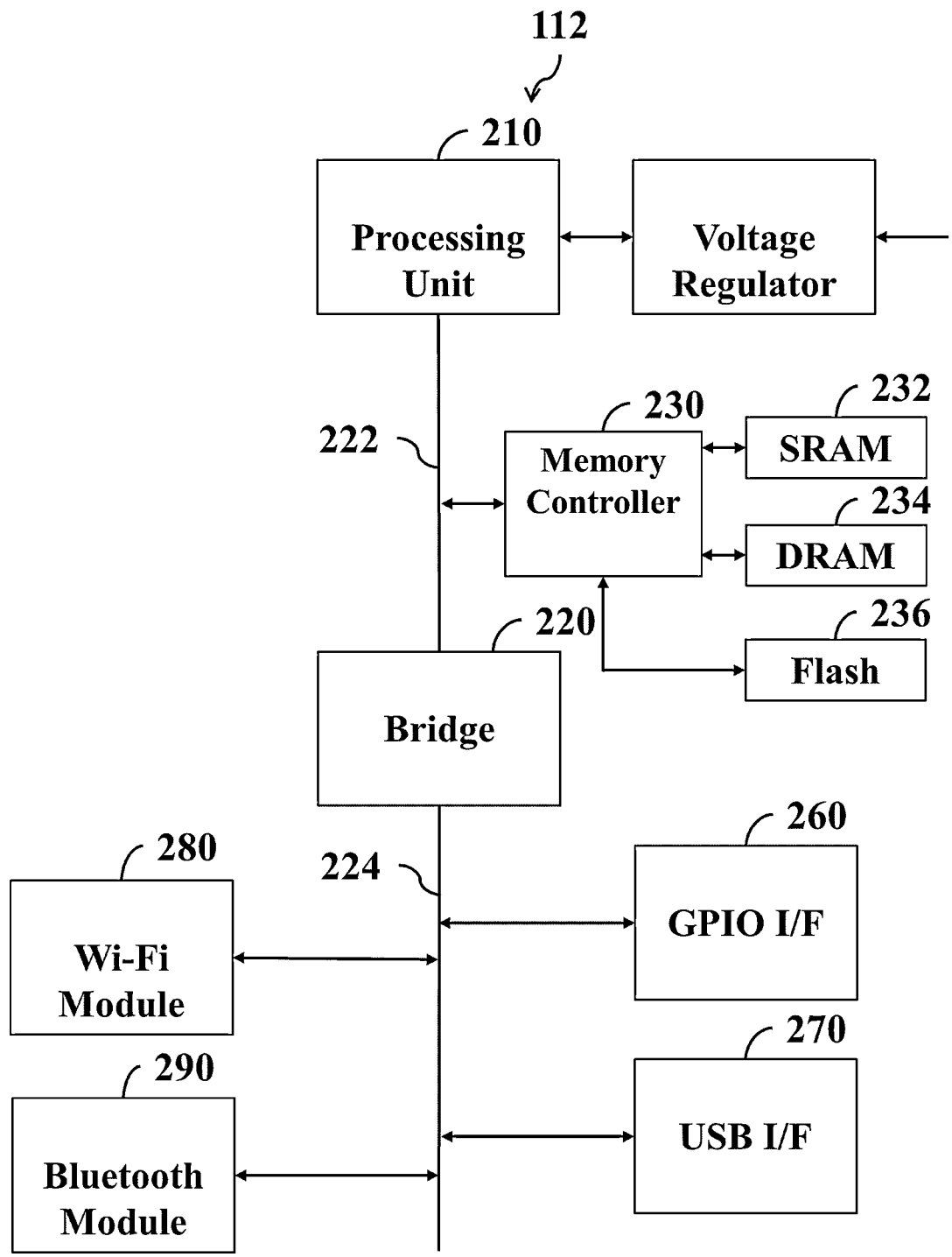
FIG. 2 is the system architecture of Raspberry Pi according to an embodiment of the invention.

Refer to FIG. 2 illustrating the system architecture of the Raspberry Pi 112. The processing unit 210 may be an ARM-based processor, and when executing the instructions of the debugging application, performs the functions described below. The tool developer may use Python to write the instructions of debugging application. The Raspberry Pi 112 may include different types of buses that can be used in combination: Advanced High-performance Bus/Advanced System Bus (AHB/ASB) 222; and Advanced Peripheral Bus (APB) 224. The AHB/ASB 222 and the APB 224 are connected by the bridge 220, AHB/ASB 222 satisfies the requirements of high-speed bandwidth between the processing unit 210 through the memory controller 230 and the SRAM 232, the DRAM 234 or the flash memory 236, APB 224 is suitable for peripheral devices with low power consumption, such as the GPIO I/F 260, the USB I/F 270, the Wi-Fi module 280, the Bluetooth module 290, etc. The processing unit 210 may simulate the HAG behavior through the GPIO I/F 260, and receive such as UART data, signals, messages, etc., through the USB I/F 270. The processing unit 210 may receive a debugging request from a remote device through the Wi-Fi module 280 or the Bluetooth module 290, and load and execute the debugging application in response.

Figure 5:
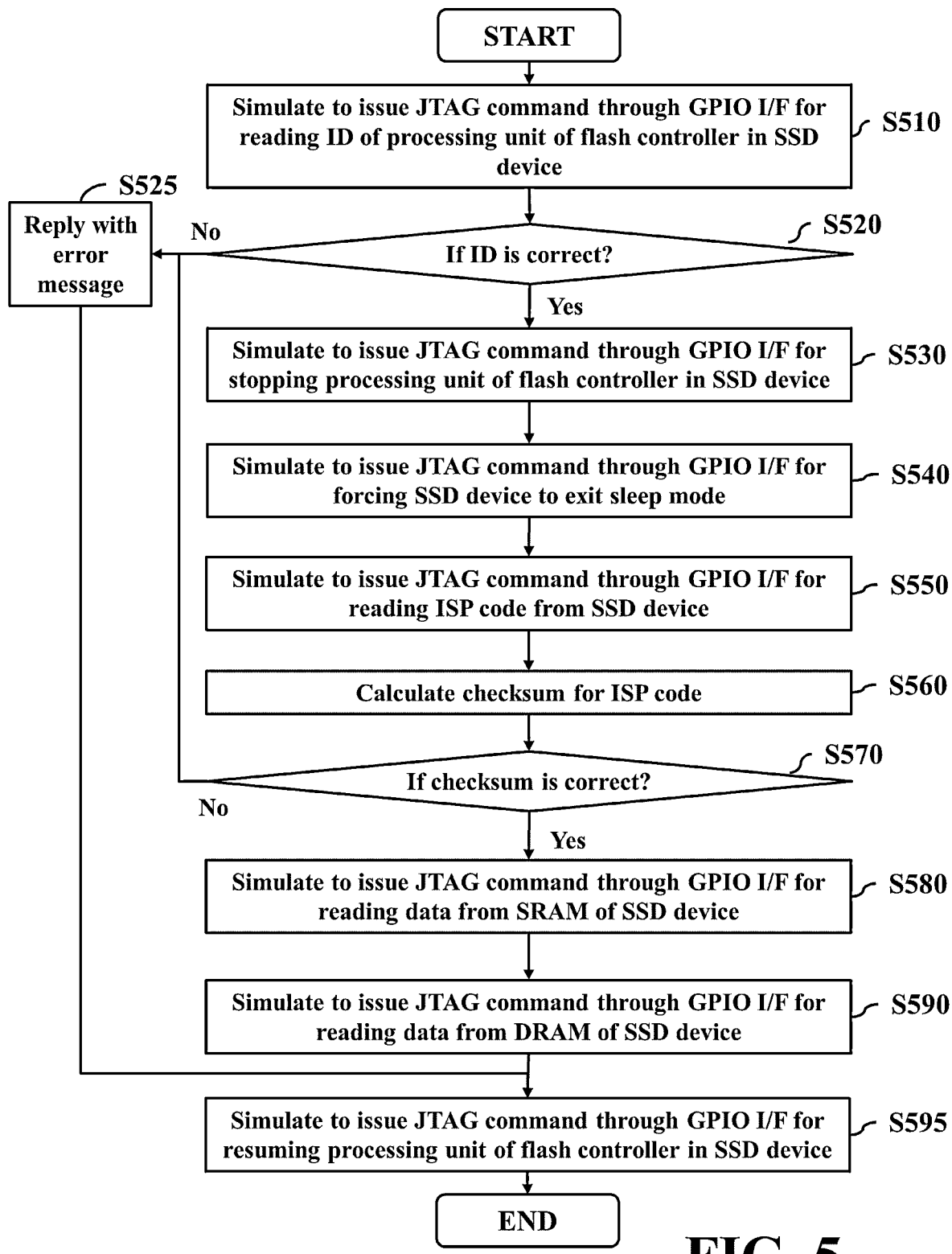
FIG. 5 is a flowchart illustrating a method for debugging solid-state disk (SSD) devices, performed by a debugging application, according to an embodiment of the invention.

An embodiment of the invention introduces a method for debugging SSD, which is performed by the processing unit 210 when loading and executing program codes of the debugging application. Referring to FIG. 5, the detailed description is as follows:

Step S510: The JTAG command is simulated to issue through the GPIO I/F 260 for reading the identifier (ID) of the processing unit 125 of the flash controller 121 in the SSD device 120, such as ARC ID, ARM ID, etc. For example, the ID of the processing unit 125 is read from the designated address of the AUX register 122 in the SSD device 120. In some embodiments, ARC ID is recorded in the $0^{th}$ to $7^{th}$ bits of the $4^{th}$ double-byte "ARCVER[7:0]" in FIG. 3.

Step S520: It is determined whether the ID is correct. If the ID is correct, then the process proceeds to step S530. Otherwise, the process proceeds to step S525. This step can be used to confirm if the debugging device 110 is properly connected to the SSD device 120. If the processing unit 210 cannot read the ID associated with the processing unit 125 of the flash controller 121 from the SSD device 120, then it means that the debugging device 110 is not properly connected to the SSD device 120.

Step S525: The debugging application replies with an error message to the upper layer that started the debugging application. The upper layer may drive a display to show the error message, or store the error message in the flash memory 236 to inform an engineer that an error has occurred during the debugging.

Step S530: The JTAG command is simulated to issue through the GPIO I/F 260 for stopping the running of the processing unit 125 of the flash controller 121 in the SSD device 120. For example, the value of designated address of the AUX register 122 in the SSD device is modified to stop the processing unit 125. In some embodiments, the $1^{st}$ bit of the $5^{th}$ double-byte "FH" in FIG. 3 is set to "1" to stop the processing unit 125.

Step S540: The JTAG command is simulated to issue through the GPIO I/F 260 for forcing the SSD device 120 to exit the sleep mode. For example, the value of designated address of the AUX register 122 in the SSD device is modified to exit the sleep mode. In some embodiments, the $23^{th}$ bit of the $5^{th}$ double-byte "ZZ" in FIG. 3 is set to "0" to force the SSD device 120 to exit the sleep mode.

Step S550: The JTAG command is simulated to issue through the GPIO I/F 260 for reading the in-system programming (ISP) code from the SSD device 120. For example, the ISP code may be stored in the designated address of the flash module 128, and the debugging application simulates the JTAG command for reading a predefined length of data (that is, the ISP code) from the designated address of the flash module 128. The ISP code contains a variety of processes for executing host commands issued by a host, or performing background operations, such as the garbage collection (GC), the wear leveling (WL), the read reclaim, the read refresh processes, and the like. The host commands are commands that are defined by a standard-setting organization, such as Universal Flash Storage (UFS), Non-Volatile Memory Express (NVMe), Open-channel SSD, etc.

Step S560: A checksum for the ISP code is calculated. The debugging application may use predetermined algorithm to calculate the checksum, such as MD5, SHA1, SHA256, SHA512, etc.

Step S570: It is determined whether the checksum is correct. If the checksum is correct, then the process proceeds to step S580. Otherwise, the process proceeds to step S525. In some embodiments, since the manufacturer of the flash controller 121 in the SSD device 120 may provide different versions of ISP code in response to different types of NAND flash memory, the flash memory 236 in the Raspberry Pi 112 may store several checksums corresponding to different versions of ISP codes, respectively, in advance. The debugging application may compare the checksum generated in step S560 with the checksums stored in the flash memory 236. If the checksum generated in step S560 matches any of the checksums stored in the flash memory 236, then the generated checksum is correct (also, the ISP code executed in the flash controller 121 of the SSD device 120 can be recognized as the specific version of ISP code). Otherwise, the generated checksum is incorrect (that is, the ISP code executed in the flash controller 121 of the SSD device 120 is incorrect, or unable to recognize). This step is used not only to judge if the generated checksum is correct, but also to know which version of ISP code that is currently executed in the flash controller 121. It is noted that different versions of ISP codes have different logics for allocating memory space to store such as variables, data tables, data to be programmed into the flash module 128, data has been read from the flash module 128 etc. in execution. That is, the debugging application needs to know the memory allocation logic first, and then dumps required data from the designated addresses of the memory 126 (including SRAM, DRAM, or both) in the SSD device 120 according to the memory allocation logic.

Step S580: The JTAG command is simulated to issue through the GPIO I/F 260 for reading data from the SRAM in the SSD device 120. For example, firmware data generated during boot-up or during normal operation is stored at specified addresses in the SRAM. The debugging application may issue multiple JTAG commands to the SSD device 120, and each JTAG command requests to read the specified length of data (i.e. firmware data) from the specified address of the SRAM. In some embodiments, the flash memory 236 in the Raspberry Pi 112 may store a document having multiple records. Each record includes information about a start address and a length. The debugging application may issue a JTAG command to the SSD device 120 for reading the specified length of data from the specified address of the SRAM according to each record in the document.

Step S590: In some embodiments with DRAM in the memory 126, the JTAG command is simulated to issue through the GPIO I/F 260 for reading data from the DRAM in the SSD device 120. For example, firmware data generated during boot-up or during normal operation is stored at specified addresses in the DRAM. The debugging application may issue multiple JTAG commands to the SSD device 120, and each JTAG command requests to read the specified length of data (i.e. firmware data) from the specified address of the DRAM. In some embodiments, the flash memory 236 in the Raspberry Pi 112 may store a document having multiple records. Each record includes information about a start address and a length. The debugging application may issue a JTAG command to the SSD device 120 for reading the specified length of data from the specified address of the DRAM according to each record in the document.

Step S595: The JTAG command is simulated to issue through the GPIO I/F 260 for resuming the processing unit 125 of the flash controller 121 in the SSD device 120. For example, the value of designated address of the AUX register 122 in the SSD device 120 is modified to resume the processing unit 125. In some embodiments, the $1^{st}$ bit of the $5^{th}$ double-byte "FH" in FIG. 3 is set to "0" to resume the processing unit 125.

The following shows exemplary pseudo code of the debugging application:

```
read aux_register bit[7:0] of DWORD 4 as arc_arm_ID //Obtain
ARC/ARM ID
If arc_arm_ID == False
    return error
EndIf
write "1" into aux_register bit[1] of DWORD 5 //Stop SSD CPU
write "0" into aux_register bit[23] of DWORD 5 //Leave sleep mode
read memory_ISP //Dump ISP Code
//Compare MD5
Calculate memory_ISP as MD5_ISP
If MD5_ISP != MD5_Target
    return error
EndIf
//Dump destination memory
For readLine(target_memory_list) != endOfFile
    read memory_Target
    save as memory_Target.bin
EndFor
//Dump DRAM
If DRAM==True
    For readLine(dram_memory_list) != endOfFile
        read memory_dram
        save as memory_dram.bin
    Endfor
EndIf
//Resume CPU
If freeRun==True
    write "0" into aux_register bit[1] of DWORD 5
EndIf
```

The method for debugging SSD devices implemented by the debugging application as described above would be more flexible than the ICE to solve the problems encountered during the debugging. For example, when the firmware of the SSD device is stuck, the hardware register would be quickly accessed to obtain the statuses of the NAND flash memory.

Refer to FIGS. 1 and 2, The UART recording device 150 includes the USB I/F, the UART I/F, the controller, and the memory. The USB I/F of the UART recording device 150 is connected to the USB I/F of the Raspberry Pi 112, and the UART I/F of the UART recording device 150 is connected to the UART I/F 124 of the SSD device 120. The UART recording device 150 receives log information including such as data, message, signals, etc. from the SSD device 120 through its UART I/F, and sends the log information to the Raspberry Pi 112 through its USB I/F. The UART recording device 150 includes a non-volatile storage unit for storing the log information received from the SSD device 120. Each port on the USB I/F is connected to the designated port on the UART I/F through a level shifter. The level shifter is used to translate an input signal from the voltage domain of USB I/F to the voltage domain of UART I/F, or translate an input signal from the voltage domain of UART I/F to the voltage domain of USB I/F.

Figure 6:
FIG. 6 is a schematic diagram showing pins of General-Purpose Input/Output (GPIO) interface (I/F) in Raspberry Pi according to an embodiment of the invention.

With references made to FIG. 6, the Raspberry Pi 112 may be connected to the JTAG add-on board 114 through 40 pins of the GPIO I/F 260. The JTAG add-on board 114 is capable of transmitting signals between the Raspberry Pi 112 and the JTAG connection device 140 and transmitting signals between the Raspberry Pi 112 and the PC 130. The JTAG add-on board 114 includes the GPIO I/F and the type-C I/F, the GPIO I/F is connected to the Raspberry Pi 112 and the PC 130, and the type-C I/F is connected to the JTAG connection device 140. Each port on the GPIO I/F is connected to the designated port on the type-C I/F through a level shifter. The level shifter is used to translate an input signal from the voltage domain of GPIO I/F to the voltage domain of type-C I/F, or translate an input signal from the voltage domain of type-C I/F to the voltage domain of GPIO I/F.

Figure 7:
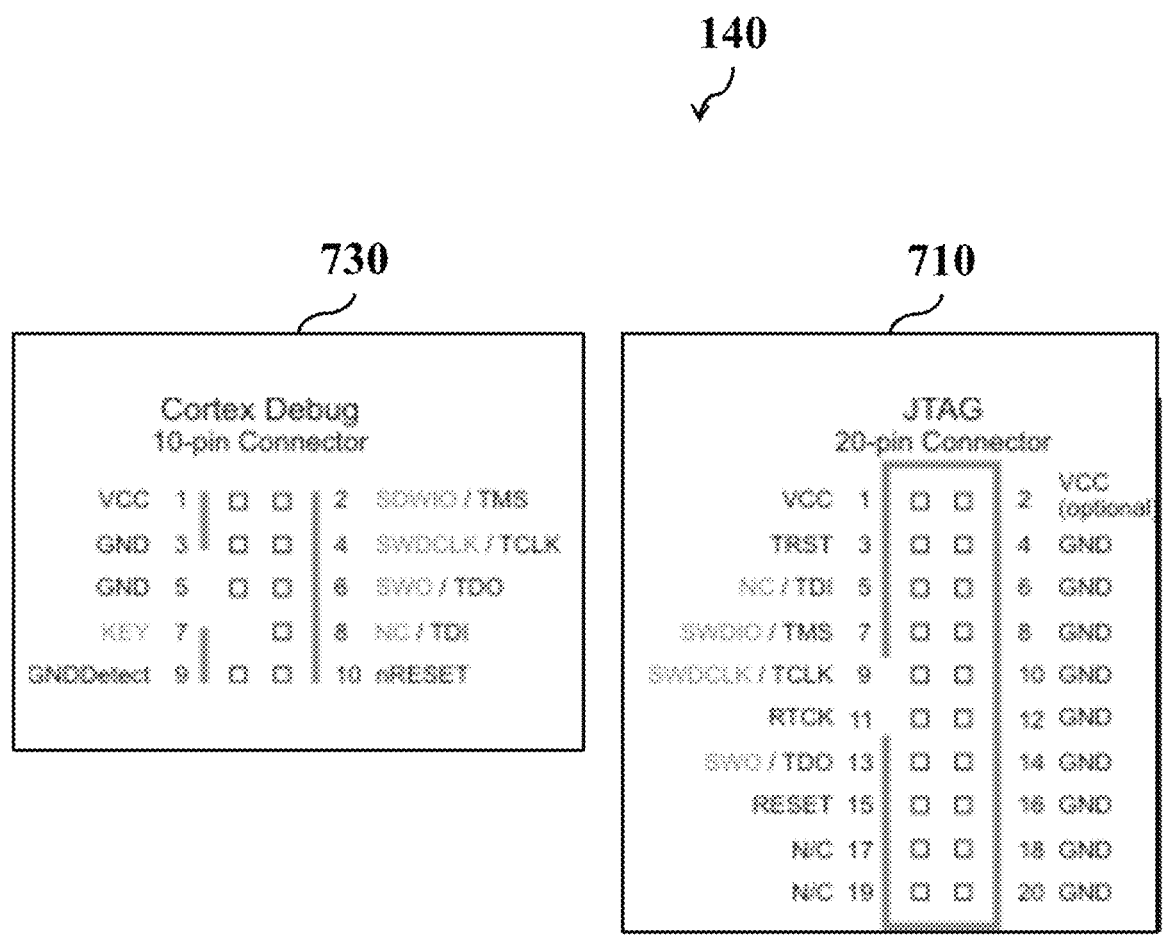
FIG. 7 is a schematic diagram showing Joint Test Action Group (JTAG) 20-pin to 10-pin in a JTAG connection device according to an embodiment of the invention.

The JTAG connection device 140 can be regarded as a JTAG adaptor, such as 20-pin to 10-pin, 20-pin to 8-pin, etc., and is capable of transmitting the JTAG commands emulated by the Raspberry Pi 112, and data from the JTAG add-on board 114 to the SSD device 120, and transmitting the data output from the SSD device 120 to the Raspberry Pi 112 through the HAG add-on board 114. The JTAG connection device 140 includes the type-C I/F, the JTAG I/F, the controller and the memory. The type-C I/F of JTAG connection device 140 may be connected to the type-C I/F of the JTAG add-on board 114, and the JTAG I/F of the JTAG connection device 140 may be connected to the JTAG I/F 123 of the SSD device 120. It is noted that, since the SSD device 120 needs to be tested in a test chamber under a high temperature environment, the JTAG connection device 140 is independent from the JTAG add-on board 114, instead of integrating the JTAG connection device 140 into the JTAG add-on board 114, so that the SSD device 120 and the JTAG connection device 140 can be placed in the test chamber together for debugging operations. Refer to FIG. 7 illustrating the exemplary JTAG 20-pin to 10-pin adaptor including the 20-pin connector 710 for connecting the JTAG add-on board 114, and the 10-pin connector 730 for connecting to the JTAG I/F 123. For example, the $9^{th}$ pin of the connector 710 is used to feed in the test clock (TCLK) signal from the JTAG add-on board 114, and the $4^{th}$ pin of the connector 730 is used to output the clock signal to the JTAG I/F 123. The $7^{th}$ pin of the connector 710 is used to input the test mode select input (TMS) signal from the JTAG add-on board 114, and the $2^{nd}$ pin of the connector 730 is used to output the TMS signal to the JTAG I/F 123. The $5^{th}$ pin of the connector 710 is used to input the test data input (TDI) signal from the JTAG add-on board 114, and the $8^{th}$ pin of the connector 730 is used to output the TDI signal to the JTAG I/F 123. The $13^{th}$ pin of the connector 730 is used to input the test data output (TDO) signal from the JTAG I/F 123, and the $6^{th}$ pin of the connector 710 is used to output the TDO signal to the JTAG add-on board 114. The $10^{th}$ pin of the connector 710 is used to input the test reset input (TRST) signal from the JTAG add-on board 114, and the $3^{rd}$ pin of the connector 730 is used to output the TRST signal to the JTAG I/F 123. Each pin of the connector 710 is connected to the designated pin of the connector 730 through a level shifter. The level shifter is used to translate an input signal from the voltage domain of type-C to the voltage domain of JTAG I/F, or translate an input signal from the voltage domain of JTAG to the voltage domain of type-C I/F.

Figure 8:
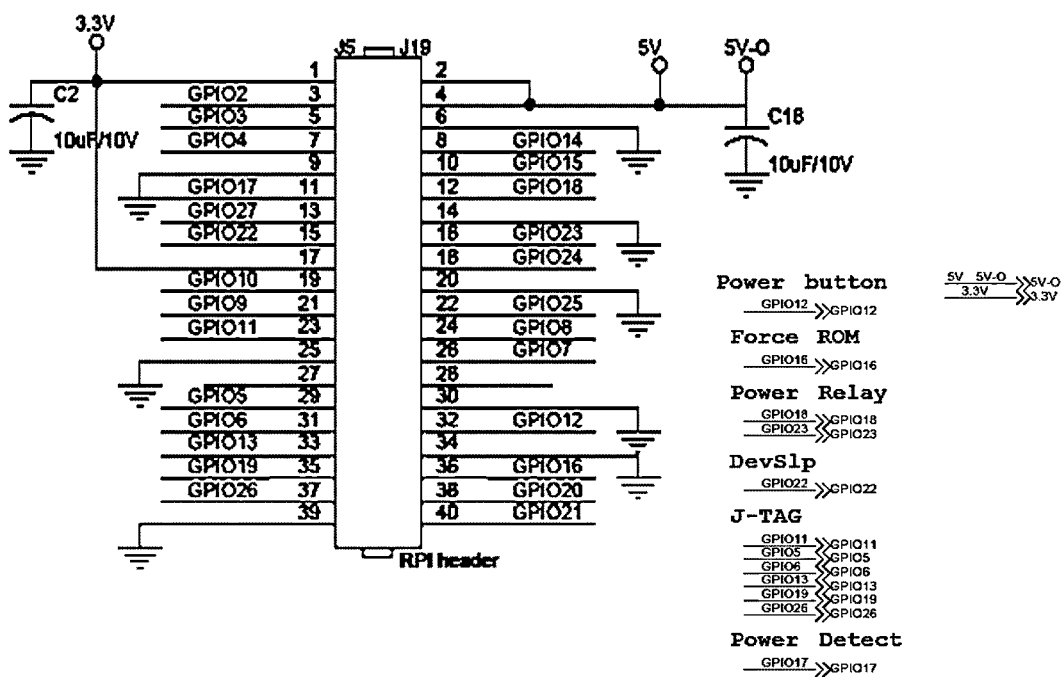
FIG. 8 is the pin-out diagram for GPIO I/F in a Raspberry Pi according to an embodiment of the invention.

Three power relays may be disposed on the JTAG add-on board 114, which are connected to the power source. Refer to FIG. 8 illustrating the pin-out diagram for the exemplary GPIO I/F 260. The pins GPIO12, GPIO18 and GPIO23 are respectively used to control three power relays disposed on the JTAG add-on board 114 for feeding in the power source 160 to the PC 130. The pin GPIO17 is connected to the signal line for driving an LED in the PC 130 and is used to detect if the PC 130 starts successfully. The pin GPIO16 is connected to the designated pin of the SSD device 120 for directing the SSD device 120 to enter the ROM mode. The pin GPIO22 is connected to the designated pin of the SATA I/F in the SSD device 120 for directing the SSD device 120 to enter or exit the sleep mode. It is noted that the sleep mode instructed through the SATA cuts off power to most of the components in the SSD device 120 (including the processing unit 125) to save power. In other words, when the sleep mode is entered through the SATA I/F, the processing unit 125 in the SSD device 120 does not perform any operation. The sleep mode that is exited in response to the JTAG command issued by the debugging application, as described above, is different from the sleep mode that is entered through the SATA I/F. The pins GPIO11, GPIO5, GPIO6, GPIO13, GPIO19 and GPIO26 are connected to the JTAG I/F 123 in the SSD device 120 through the JTAG add-on board 114 and the JTAG connection device 140, and are used for the processing unit 210 in the Raspberry Pi 112 when executing the debugging application to simulate the JTAG behavior for issuing the JTAG commands to the SSD device 120, so that the ISP code and the firmware data are obtained from the SSD device 120. For example, the pin GPIO5 is used to send the JTAG TDI signal to the SSD device 120 and the GPIO6 is used to receive the JTAG TDO signal from the SSD device 120. For simulation details of JTAG behavior, refer to *IEEE Standard Test Access Port and Boundary-Scan Architecture* admitted on Jun. 14, 2001.

Refer to FIG. 2. The Raspberry Pi 112 is a low-cost PC and therefore does not implement the low latency peripheral port (LLPP) technology, which uses a dedicated path to access the GPIO I/F. When the debugging application in the upper layer accesses to the content of the AUX register 122 or the memory 126 in the SSD device 120 by issuing a JTAG command through the GPIO I/F, the GPIO driver in the lower layer issues a hardware instruction with relevant parameters to the GPIO I/F 260 through AHB/ASB 222 and the APB 224 in sequence for writing (or setting) a value to the register corresponding to the designated pin in the GPIO I/F 260 to complete the specified simulation of JTAG command. However, due to hardware limitations, some hardware instructions may be delayed to arrive at the APB 224. When two hardware instructions for writing to the same register in the GPIO I/F 260 arrive at the APB controller in a very short time interval, the APB controller may mistakenly judge them as incorrect instructions and discard one of them from executing, so that such as certain portions of ISP codes, firmware data, etc. cannot be read back from the SSD device 120.

Figure 9:
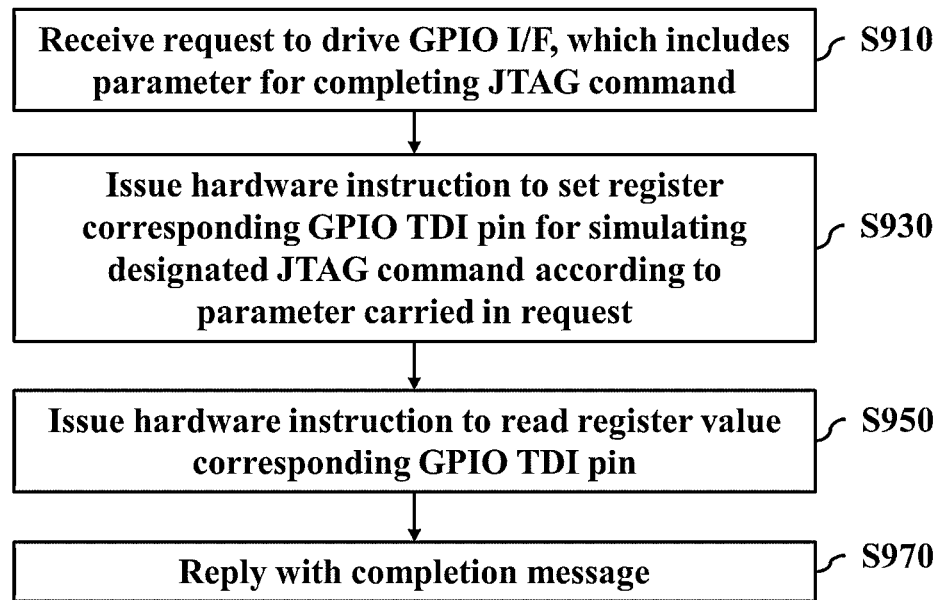
FIG. 9 is a flowchart illustrating a method for debugging SSD devices, performed by a function in a runtime library, according to an embodiment of the invention.

To address the aforementioned problems, in an embodiment of the invention, the function in the runtime library is modified, which is called by the debugging application to execute for driving the GPIO I/F 260 to complete operations including, for example, the issuance of JTAG commands to read the ID of the processing unit 125 of the flash controller 121 in the SSD device 120, stop the processing unit 125 of the flash controller 121 in the SSD device 120, force the SSD device to exit the sleep mode, read ISP codes stored in the flash module 128 of the SSD device 120, read data from SRAM, DRAM of the SSD device 120, and so on. The runtime library is a collection of built-in functions used by a compiler to implement a programming language to provide a special computer program library that is supported during execution of the programming language. Refer to FIG. 9, the detailed description is as follows:

Step S910: A request to drive the GPIO I/F is received from the debugging application, which includes one or more relevant parameters for completing a specific JTAG command. For example, corresponding to step S510 in FIG. 5, refer to FIG. 3, the parameter of the request includes information for setting the $1^{st}$ bit of the $5^{th}$ double-byte in the AUX register 122 to "1". In correspondence to step S540 in FIG. 5, refer to FIG. 3, the parameter of the request includes information for setting the $23^{th}$ bit of the $5^{th}$ double-byte in the AUX register 122 to "0". In correspondence to step S550 in FIG. 5, the parameter of the request includes information for reading the specified length of data from the specified address of the flash module 128. In correspondence to step S580 in FIG. 5, the parameter of the request includes information for reading the specified length of data from the specified address of the SRAM. In correspondence to step S590 in FIG. 5, the parameter of the request includes information for reading the specified length of data from the specified address of the DRAM.

Step S930: A hardware instruction is issued to the GPIO I/F 260 to set the register corresponding to the GPIO TDI pin for simulating the designated JTAG command according to the parameters carried in the request.

Step S950: A hardware instruction is issued to the GPIO I/F 260 to read the register value corresponding to the GPIO TDI pin Due to the operation of this step, one hardware instruction for reading the register value corresponding to the GPIO TDI pin is inserted between two hardware instructions for setting the register corresponding to the GPIO TDI pin, which are generated for two requests. It would prevent the APB controller from mistakenly judging two hardware instructions for setting the register corresponding to the GPIO TDI pin, which are arrived successively in a very short time interval, as incorrect hardware instructions. It is to be understood that this step may be modified to be executed between steps S910 and S930, and the invention should not be limited thereto.

Step S970: A completion message for the driving of GPIO I/F 260 is replied to the debugging application.

The processing unit 210 of the Raspberry Pi 112 may periodically executes another function of runtime library for driving the GPIO I/F 260 to read the register value corresponding to the GPIO TDO pin. The read values are execution outcomes for the JTAG commands that were simulated to issue through the GPIO TDI pin, which are generated by SSD device 120 and may include such as a message indicating a success or a failure of setting to the AUX register 122, the ISP codes read from the flash module 28, firmware data read from the SRAM or DRAM, etc.

Some or all of the aforementioned embodiments of the method of the invention may be implemented in a computer program such as a driver for a dedicated hardware, a firmware program, a software program, or others. Other types of programs may also be suitable, as previously explained. Since the implementation of the various embodiments of the present invention into a computer program can be achieved by the skilled person using his routine skills, such an implementation will not be discussed for reasons of brevity. The computer program implementing some or more embodiments of the method of the present invention may be stored on a suitable computer-readable data carrier such as a DVD, CD-ROM, USB stick, a hard disk, which may be located in a network server accessible via a network such as the Internet, or any other suitable carrier.

Although the embodiment has been described as having specific elements in FIGS. 1 and 2, it should be noted that additional elements may be included to achieve better performance without departing from the spirit of the invention. Each element of FIGS. 1 and 2 is composed of various circuits and arranged operably to perform the aforementioned operations. While the process flows described in FIGS. 5 and 9 include a number of operations that appear to occur in a specific order, it should be apparent that these processes can include more or fewer operations, which can be executed serially or in parallel (e.g., using parallel processors or a multi-threading environment).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An apparatus for debugging a solid-state disk (SSD) device, comprising:
   a Joint Test Action Group (JTAG) add-on board; and
   a Raspberry Pi, comprising:
      a first General-Purpose Input/Output (GPIO) interface (I/F), coupled to the JTAG add-on board; and
      a processing unit, coupled to the first GPIO I/F, arranged operably to: simulate to issue a plurality of JTAG command through the first GPIO I/F to the SSD device for dumping data generated by the SSD device during operation from the SSD device,
   wherein the processing unit is arranged operably to: simulate to issue a first JTAG command through the first GPIO I/F to the SSD device for stopping a running of a processing unit of a flash controller in the SSD device; simulate to issue a second JTAG command through the first GPIO I/F to the SSD device for forcing the SSD device to exit a sleep mode; and simulate to issue a third JTAG command through the first GPIO I/F to the SSD device for reading a designated length of data from a static random access memory (SRAM) in the SSD device.

2. The apparatus of claim 1, wherein the Raspberry Pi is a single-board personal computer (PC) based on Linux operating system.

3. The apparatus of claim 1, wherein the JTAG add-on board comprises:
   a second GPIO I/F, coupled to the first GPIO I/F; and
   a first type-C I/F, coupled to a second type-C I/F in a JTAG connection device, thereby enabling the JTAG commands to be issued to the SSD device through the JTAG connection device.

4. The apparatus of claim 3, wherein the JTAG add-on board comprises:
   a power relay, connected to a power source, arranged operably to be controlled by the Raspberry Pi through the second GPIO I/F to feed in the power source to a personal computer (PC) and the SSD device, wherein the PC is connected to the SSD device.

5. The apparatus of claim 1, wherein Raspberry Pi comprises:
   a wireless communications module, coupled to the processing unit, arranged operably to: receive a debugging request from a remote device,
   wherein the processing unit, when loading and executing a debugging application, is arranged operably to dump data generated by the SSD device during operation from the SSD device in response to the debugging request.

6. The apparatus of claim 1, wherein the first JTAG command is issued to set a $1^{st}$ bit of a $5^{th}$ double-byte of an auxiliary register in the SSD device to "1", and the second JTAG command is issued to set a $23^{th}$ bit of the $5^{th}$ double-byte of the auxiliary register in the SSD device to "0".

7. The apparatus of claim 1, wherein the processing unit is arranged operably to: simulate to issue a fourth JTAG command through the first GPIO I/F to the SSD device for reading a designated length of data from a dynamic random access memory (DRAM) in the SSD device.

8. The apparatus of claim 1, wherein the processing unit is arranged operably to: simulate to issue a fifth JTAG command through the first GPIO I/F to the SSD device for reading an identifier of the processing unit of the flash controller in the SSD device; determine whether the identifier is correct; and simulate to issue the first JTAG command, the second JTAG command and the third JTAG command through the first GPIO I/F to the SSD device when the identifier is correct.

9. The apparatus of claim 8, wherein the fifth JTAG command is issued to read a value of $0^{th}$ to $7^{th}$ bits of a $4^{th}$ double-byte of the auxiliary register in the SSD device.

10. The apparatus of claim 1, wherein the processing unit is arranged operably to: simulate to issue a sixth JTAG command through the first GPIO I/F to the SSD device for reading in-system programming (ISP) code from a flash module in the SSD device; calculate a first checksum for the ISP code; and simulate to issue the third JTAG command through the first GPIO I/F to the SSD device when the first checksum is correct.

11. The apparatus of claim 1, wherein the Raspberry Pi comprises:
   a flash memory, coupled to the processing unit, arranged operably to: store a plurality of second checksums for a plurality of ISP code versions;
   wherein the processing unit is arranged operably to: when the first checksum matches any of the second checksums, obtain a memory-space allocation logic corresponding to a matched ISP code version; and simulate to issue the third JTAG command through the first GPIO I/F to the SSD device according to the memory-space allocation logic.

12. A system for debugging a solid-state disk (SSD) device, comprising:
   a debugging device, comprising:
      a Joint Test Action Group (JTAG) add-on board, comprising:
         a first General-Purpose Input/Output (GPIO) interface (I/F); and
         a first type-C I/F; and
      a Raspberry Pi, comprising:
         a second GPIO I/F, coupled to the first GPIO I/F; and
         a processing unit, coupled to the second GPIO I/F, arranged operably to: simulate to issue a plurality of JTAG command through the second GPIO I/F to the SSD device for dumping data generated by the SSD device during operation from the SSD device through the second GPIO I/F, and
   a JTAG connection device, comprising:
      a first JTAG I/F, coupled to a second JTAG I/F in the SSD device; and
      a second type-C I/F, coupled to the first type-C I/F in the JTAG add-on board,
   wherein the JTAG commands are received from a first pin in the second type-C I/F, and are sent to the SSD device through a second pin in the first JTAG I/F,
   wherein the data generated by the SSD device during operation are received from a third pin in the first JTAG I/F, and is sent to the JTAG add-on board through a fourth pin in the second type-C I/F.

13. The system of claim 12, comprising:
   a Universal Asynchronous Receiver/Transmitter (UART) recording device, comprising:
      a first UART I/F, coupled to a second UART I/F in the SSD device; and
      a first Universal Serial Bus (USB) I/F, coupled to a second USB I/F in the Raspberry Pi,
   arranged operably to: send log information received from the SSD device to the Raspberry Pi.

14. The system of claim 12, wherein the Raspberry Pi comprises:
- a wireless communications module, coupled to the processing unit, arranged operably to: receive a debugging request from a remote device,
- wherein the processing unit, when loading and executing a debugging application, is arranged operably to dump data generated by the SSD device during operation from the SSD device in response to the debugging request.

15. The system of claim 12, wherein the processing unit is arranged operably to: simulate to issue a first JTAG command through the second GPIO I/F to the SSD device for stopping a running of a processing unit of a flash controller in the SSD device; simulate to issue a second JTAG command through the second GPIO I/F to the SSD device for forcing the SSD device to exit a sleep mode; and simulate to issue a third JTAG command through the second GPIO I/F to the SSD device for reading a designated length of data from a static random access memory (SRAM) in the SSD device.

16. The system of claim 15, wherein the processing unit is arranged operably to: simulate to issue a fourth JTAG command through the second GPIO I/F to the SSD device for reading a designated length of data from a dynamic random access memory (DRAM) in the SSD device.

17. The system of claim 15, wherein the processing unit is arranged operably to: simulate to issue a fifth JTAG command through the second GPIO I/F to the SSD device for reading an identifier of the processing unit of the flash controller in the SSD device; determine whether the identifier is correct; and simulate to issue the first JTAG command, the second JTAG command and the third JTAG command through the second GPIO I/F to the SSD device when the identifier is correct.

18. The system of claim 15, wherein the processing unit is arranged operably to: simulate to issue a sixth JTAG command through the second GPIO I/F to the SSD device for reading in-system programming (ISP) code from a flash module in the SSD device; calculate a first checksum for the ISP code; and simulate to issue the third JTAG command through the second GPIO I/F to the SSD device when the first checksum is correct.

* * * * *